(12) United States Patent
Chang et al.

(10) Patent No.: US 8,704,376 B2
(45) Date of Patent: Apr. 22, 2014

(54) LAYOUT OF MEMORY STRAP CELL

(75) Inventors: Jacklyn Chang, San Roman, CA (US);
Evan Yong Zhang, Fremont, CA (US);
Derek C. Tao, Fremont, CA (US);
Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/443,467

(22) Filed: Apr. 10, 2012

(65) Prior Publication Data

US 2013/0264718 A1    Oct. 10, 2013

(51) Int. Cl.
*H01L 23/498* (2006.01)
(52) U.S. Cl.
USPC ................................. 257/774; 257/E23.067
(58) Field of Classification Search
USPC .......................................... 257/774, E23.067
See application file for complete search history.

(56) References Cited

U.S. PATENT DOCUMENTS

2009/0014772 A1* 1/2009 Ratnakumar et al. ......... 257/315

* cited by examiner

*Primary Examiner* — Long Pham
(74) *Attorney, Agent, or Firm* — Lowe Hauptman & Ham, LLP

(57) ABSTRACT

A layout structure includes a substrate, a well, a first dopant area, a second dopant area, a first poly region, a third dopant area, a fourth dopant area, and a second poly region. The well is in the substrate. The first poly region is in between the first dopant area and the second dopant area. The second poly region is in between the third dopant area and the fourth dopant area. The first dopant area, the second dopant area, the third dopant area, and the fourth dopant area are in the well. The first dopant area is configured to serve as a source of a transistor and to receive a first voltage value from a first power supply source. The well is configured to serve as a bulk of the transistor and to receive a second voltage value from a second power supply source.

26 Claims, 16 Drawing Sheets

LAYOUT OF MEMORY STRAP CELL

FIELD

The present disclosure is related to a layout of a memory strap cell.

BACKGROUND

In one existing approach, a memory cell includes two PMOS transistors coupled with two NMOS transistors that form two cross-coupled pairs. The sources of each PMOS transistor are coupled together and are configured to receive operational voltage VDD for the memory cell. The source and the bulk of each PMOS transistor are physically far apart, but are permanently coupled by a metal line in a strap cell area. As a result, the source and the bulk of each PMOS transistor are electrically coupled together. Because of the physical distance between the source and the bulk, the voltages at the source and at the bulk of the PMOS transistors are often different at power-on. In such a situation, a current exists and flows between the source and the bulk. The magnitude of the current is unpredictable.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 2A, 2B, 3A, and 3B are circuit diagrams of four tap devices, in accordance with some embodiments.

Like reference symbols in the various drawings indicate like elements.

DETAILED DESCRIPTION

Figure 1:
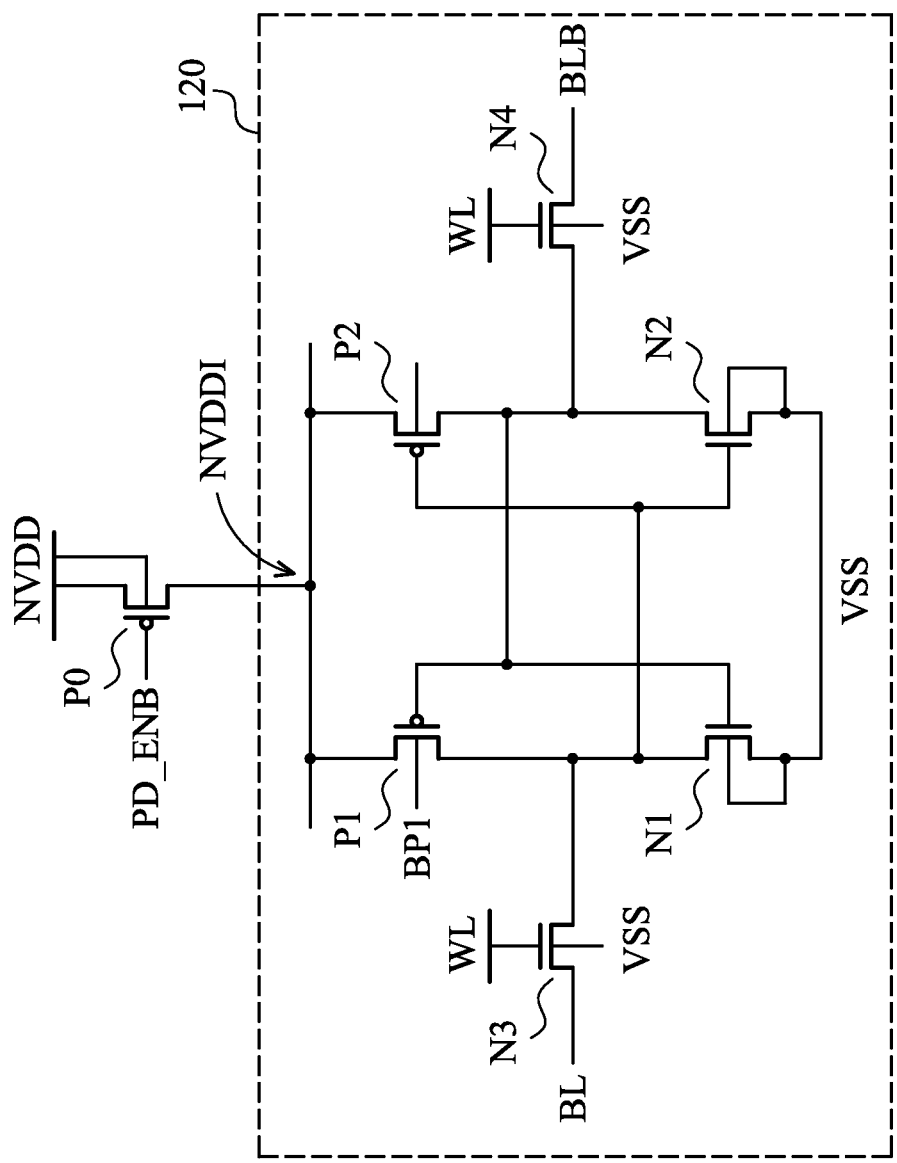
FIG. 1 is a diagram of a memory circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments related to a single port SRAM array, the leakage current is reduced. The source region and the N-well that forms the bulk of the PMOS transistors are physically separate. The N-well is configured to receive a first power source and the source region of the p-type metal-oxide-semiconductor (PMOS) transistors is configured to receive a second power source. Effectively, there are two power sources or power rails for the memory cell, one at the N-well and one at the source region of the PMOS transistors. The dual power rail system enables different mechanisms to reduce leakage current. The latch-up and/or high current during waking up from the shutdown mode is avoided.

Exemplary Circuit

FIG. 1 is a diagram of a memory circuit 100, in accordance with some embodiments. In this disclosure, "power on" refers to the sources of PMOS transistors P1 and P2 receiving operational voltage value VDD, while "power off" refers to the sources of PMOS transistors P1 and P2 receiving 0 V as the operational voltage.

Signal PD_ENB and transistor P0 provide operational voltage VDD (not labeled) at node NVDD to node NVDDI of a memory cell 120. For example, when signal PD_ENB is logically high, transistor P0 and thus operational voltage VDD are electrically disconnected from node NVDDI. Memory cell 120 is therefore powered off. In contrast, when signal PD_ENB is logically low, PMOS transistor P0 is powered on. Voltage VDD at node NVDD is transferred to node NVDDI. Effectively, node NVDDI has voltage VDD, which is called voltage VDDI. In other words, memory cell 120 is powered with operational voltage VDD.

Memory cell 120 includes two P-type metal oxide semiconductor (PMOS) transistors P1 and P2, and four N-type metal oxide semiconductor (NMOS) transistors N1, N2, N3, and N4. The gates of NMOS transistors N3 and N4 are coupled to a write word line WWL. Write word line WWL is coupled to each gate of transistors N3 and N4 of a plurality of memory cells 120 to a form a row of memory cells in a memory array.

The drain of NMOS transistor N3 is coupled to write bit line WBL while a drain of NMOS transistor N4 is coupled write bit line WBLB. Write bit lines WBL and WBLB are coupled to each drain of transistors N3 and N4 of the plurality of memory cells 120 to form a column of memory cells in the memory array. Write bit lines WBL and WBLB are commonly called write data lines.

In a write operation of memory cell 120, write word line WWL is activated. The logical values to be written to memory cell 120 are placed at write bit lines WBL and WBLB, which are then transferred to and stored at nodes ND and NDB at the sources of transistors N3 and N4, respectively. In a read operation, the data stored in node ND and NDB are transferred to a read circuit (not shown) to provide the read data.

In some embodiments, the source and the bulk of each PMOS transistor P1 and P2 are physically separate. The sources of PMOS transistors P1 and P2 are configured to receive a first power source, while the bulks of PMOS transistors P1 and P2 are configured to receive a second power source.

Figure 2B:
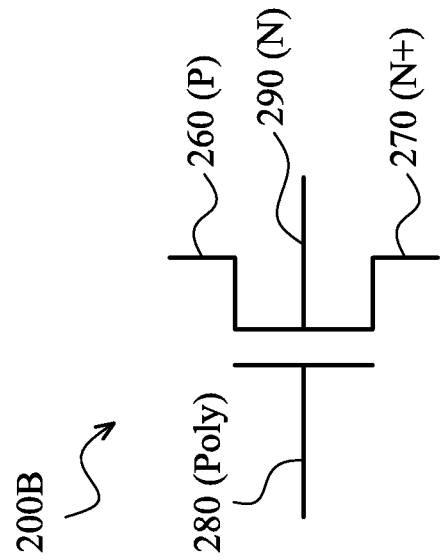
Figure 2A:
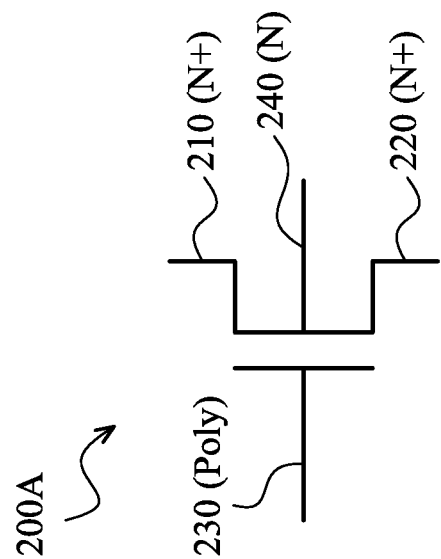

FIG. 2A is a diagram of a tap device 200A, in accordance with some embodiments. Tap device 200A includes four terminals 210, 220, 230, and 240. In some embodiments, terminals 210 and 220 are doped with N+ dopant. Terminal 230 includes poly or polysilicon, and terminal 240 is doped with N dopant, which is a lighter doped dopant than the N+ dopant.

FIG. 2B is a diagram of a tap device 200B, in accordance with some embodiments. Tap device 200B includes four terminals 260, 270, 280, and 290. In some embodiments, terminal 260 is doped with P dopant. Terminal 270 is doped with N+ dopant. Terminal 280 includes poly, and terminal 290 is doped with N dopant.

Tap devices 200A and 200B are used as means to connect an N-well of memory macro 100 to the operational voltage such as voltages VDDI and VDD.

FIG. 3A is a diagram of a tap device 300A, in accordance with some embodiments. Tap device 300A includes four terminals 310, 320, 330, and 340. In some embodiments, terminals 310 and 320 are doped with P+ dopant. Terminal 330 includes poly or polysilicon, and terminal 340 is doped with P dopant, which is a lighter doped dopant than the P+ dopant.

FIG. 3B is a diagram of a tap device 300B, in accordance with some embodiments. Tap device 300B includes four terminals 360, 370, 380, and 390. In some embodiments, terminal 360 is doped with P+ dopant. Terminal 370 is doped with N dopant. Terminal 380 includes poly, and terminal 390 is doped with P dopant.

Tap devices 300A and 300B are used as means to connect a P-well of memory macro 100 to a reference voltage such as voltage VSS.

Exemplary Layouts

Figure 4:
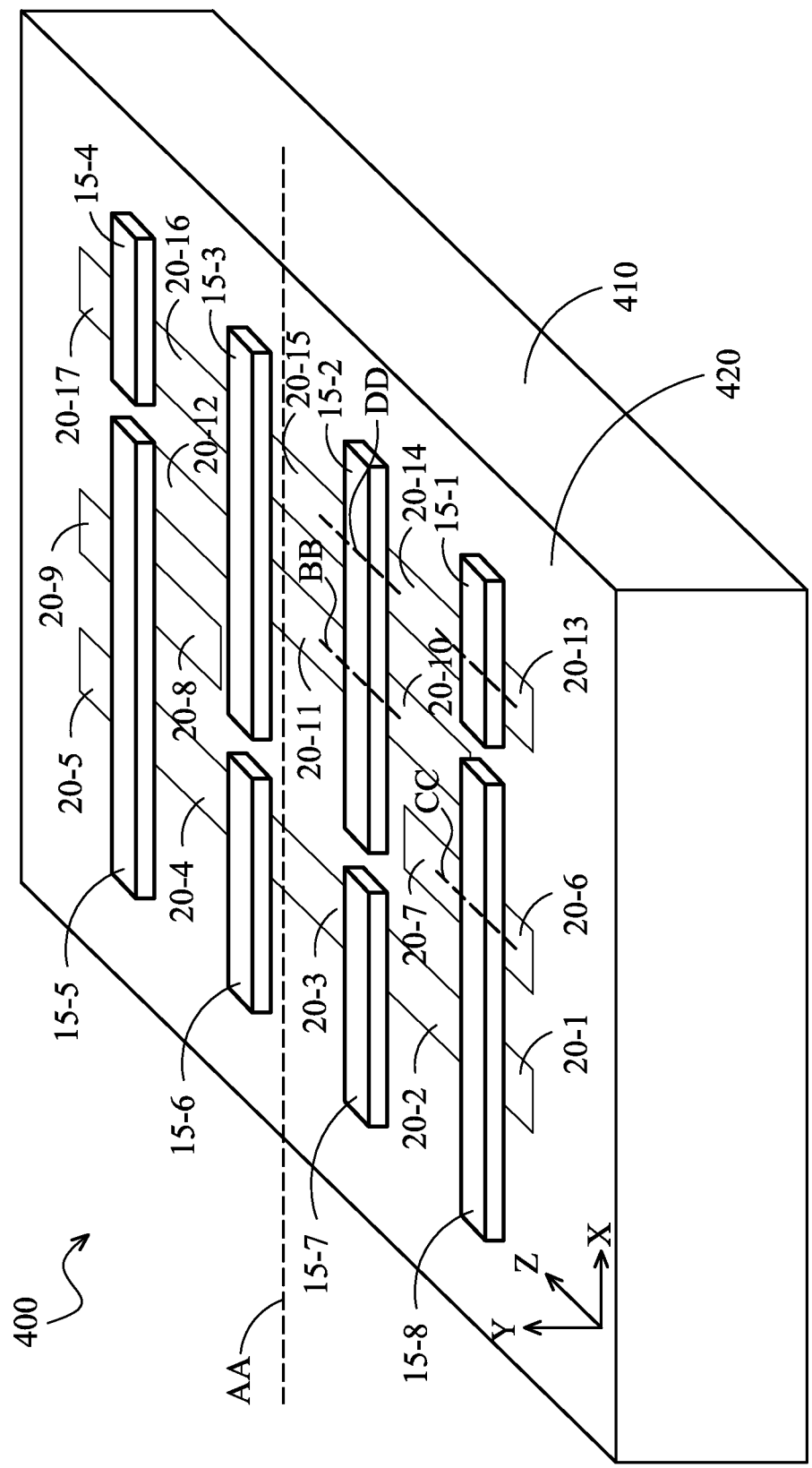
FIG. 4 is a diagram of a layout structure in a strap cell area, in accordance with some embodiments.

FIG. 4 is a diagram of a layout structure 400, in accordance with some embodiments. Layout structure 400 is used to illustrate the layouts of tap devices 200A, 200B, 300A, and 300B in corresponding FIGS. 2A, 2B, 3A, and 3B. In some embodiments, layout structure 400 is in a strap cell area of a memory macro. The strap cell area includes tap devices used as means to electrically couple the N-well to operational voltage, such as voltages VDD and VDDI, and the P-well to reference voltage such as voltage VSS.

Substrate 410 includes a plurality of diffusion areas 20. For illustration, diffusion areas 20-1 to 20-17 are shown, and are collectively called diffusion areas 20. For simplicity, each of a diffusion area 20-1 to 20-7 is called a diffusion area 20. The diffusion area 20 has a surface aligned with surface 420 of substrate 410, and a depth with reference from surface 420. In other words, each of the diffusion area 20 is three dimensional. For simplicity, the depths of diffusion areas 20 are not shown. The surfaces of diffusion regions 20 are on the same layer level. For example, the surfaces of diffusion layers 20 form a plane having the X and the Z directions.

The diffusion area 20 is doped with a type of dopant to form a doped area. Semiconductor devices are formed based on different doped areas. Exemplary semiconductor devices include transistors, diodes, metal-oxide-semiconductor (MOS) capacitors, etc. Exemplary doped areas include P-doped areas, N-doped areas, etc. Each doped area has a different degree of dopant, such as P−, P, P+, N−, N, and N+, etc.

Figure 5A:
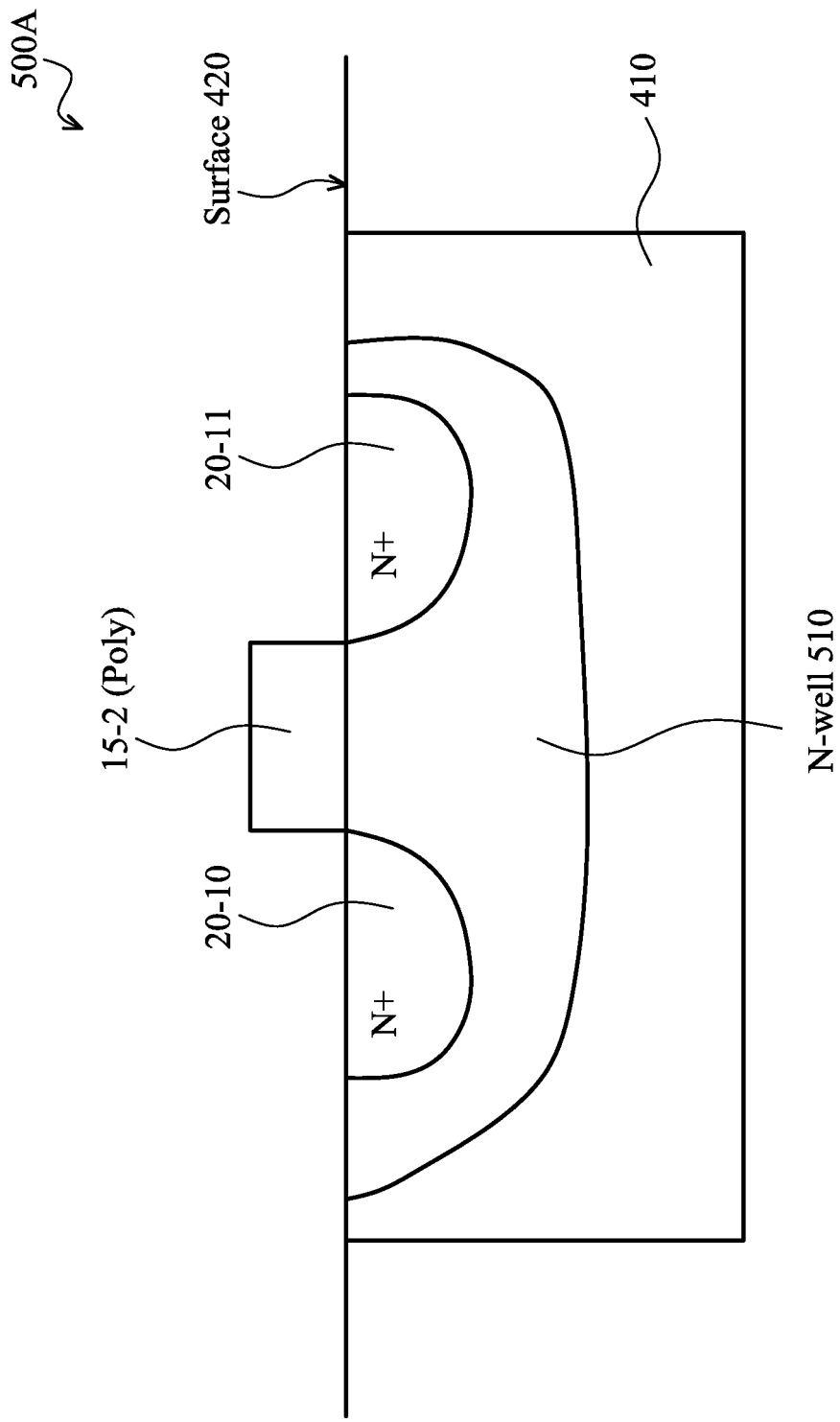
FIGS. 5A, 5B, 6A, and 6B are cross sectional views of the tap devices in corresponding FIGS. 2A, 2B, 3A, and 3B, in accordance with some embodiments.
Figure 6A:
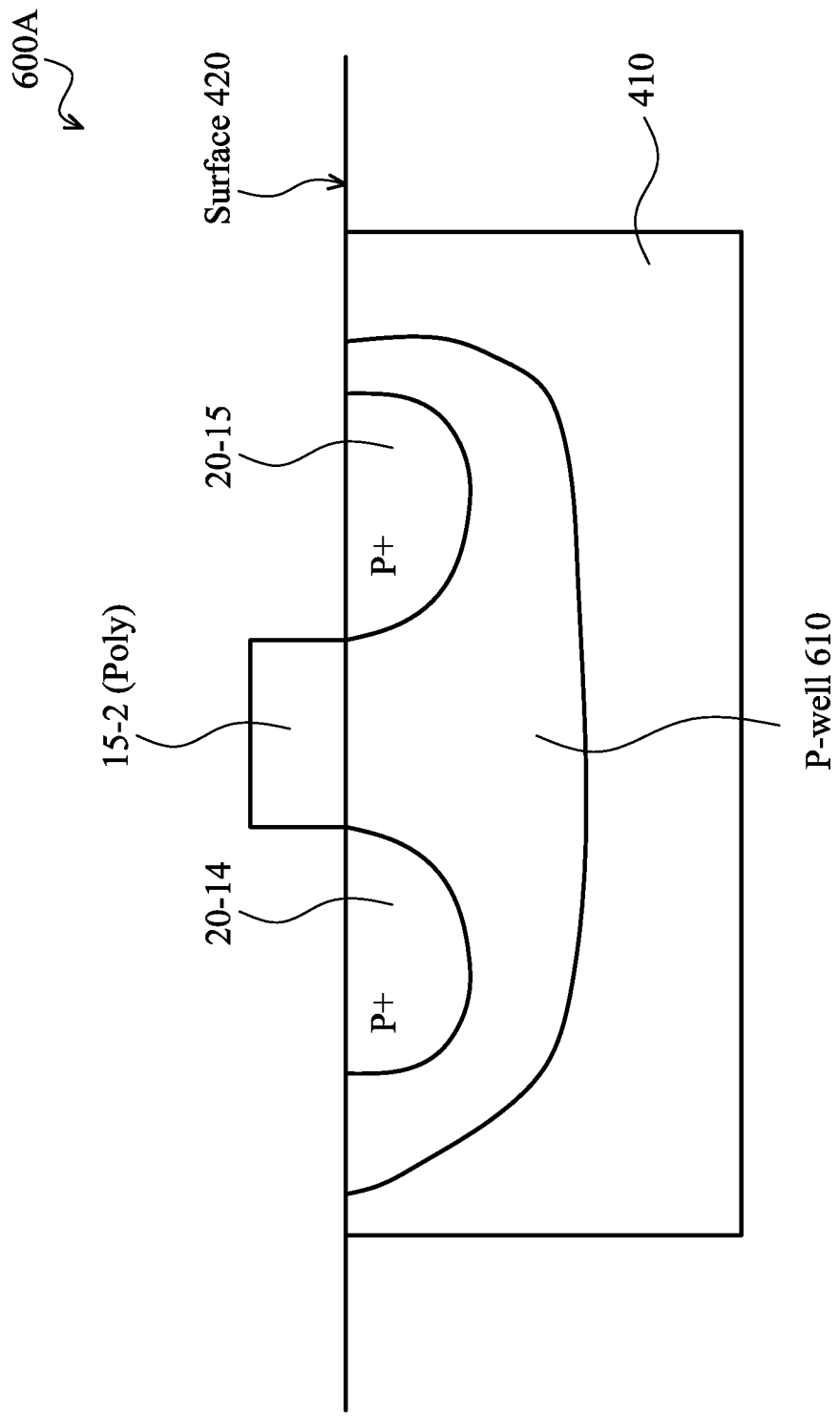

Substrate 410, also includes wells having dopants, such as N-well 510 and P-well 610 illustratively shown in FIGS. 5A and 6A, respectively.

For illustration, polysilicon or poly regions 15-1 to 15-8 are shown, and are collectively called poly regions 15. Poly regions 15 are used to form gates of different transistors, such as transistors P1, P2, N1, N2, etc., in memory cell 120 in FIG. 1. For simplicity, a poly region 15-1 to 15-8 is called a poly region 15.

In some embodiments, the poly region 15 is in between two diffusion areas 20. For example, poly region 15-1 is in between diffusion areas 20-13 and 20-14. Poly region 15-2 is in between diffusion areas 20-14 and 20-15, and poly region 15-3 is in between diffusion areas 20-15 and 20-16, etc.

Some poly regions 15 are parallel with some other poly regions 15 in the X direction. For example, each of poly regions 15-1 and 15-8 are parallel with poly regions 15-2, 15-7, 15-3, 15-6, etc.

Layout structure 400 is symmetrical with reference to a line AA in which elements on one side of line AA are similar to elements on the other side of line AA. For example, poly region 15-1 is similar to and symmetrical with poly region 15-4. Poly region 15-2 is similar to and symmetrical with poly region 15-3, etc. In some embodiments, a device formed on one side of line AA corresponds to another device formed in the other side of line AA. For simplicity, the explanation in this document is with reference to one side of line AA. The other side of line AA is similar, and should be recognizable by persons of ordinary skill in the art.

In some embodiments, layout structure 400 is used to form tap devices, such as tap devices 200A, 200B, 300A, and 300B in corresponding FIGS. 2A, 2B, 3A and 3B. A line BB is used as a reference to illustrate the cross sectional view of tap device 200A, which will be explained with reference to FIG. 5A. A line CC is used as a reference to illustrate the cross sectional view of tap device 200B, which will be explained with reference to FIG. 5B. A line DD is used as a reference to illustrate the cross sectional view of tap device 300A, which will be explained with reference to FIG. 6A. A line EE is used as a reference to illustrate the cross sectional view of tap device 300B, which will be explained with reference to FIG. 6B.

Exemplary Cross Sectional Views

FIG. 5A is a cross sectional view 500A of tap device 200A in FIG. 2A, in accordance with some embodiments. Cross sectional view 500A is with reference to line BB in FIG. 4.

Diffusion areas 20-10 and 20-11 are doped with N+ dopant, and are each inside an N-well 510 that is formed inside substrate 410. Diffusion area 20-11 forms terminal 210 of tap device 200A. Diffusion area 20-10 forms terminal 220 of tap device 200A. Poly region 15-2 forms poly terminal 230 of tap device 200A. N-well 510 forms terminal 240 of tap device 200A. In some embodiments, N-well 510 includes separate wells electrically connected together, and is therefore considered one single well.

Tap device 200A is used for illustration, another tap device, such as tap device 200A' (not labeled) similar to and symmetrical with tap device 200A with reference to line AA is formed in layout structure 400. For example, tap device 200A' is formed by diffusion regions 20-12 and 20-11, and poly region 15-3, and should be recognizable by persons of ordinary skill in the art.

Figure 5B:
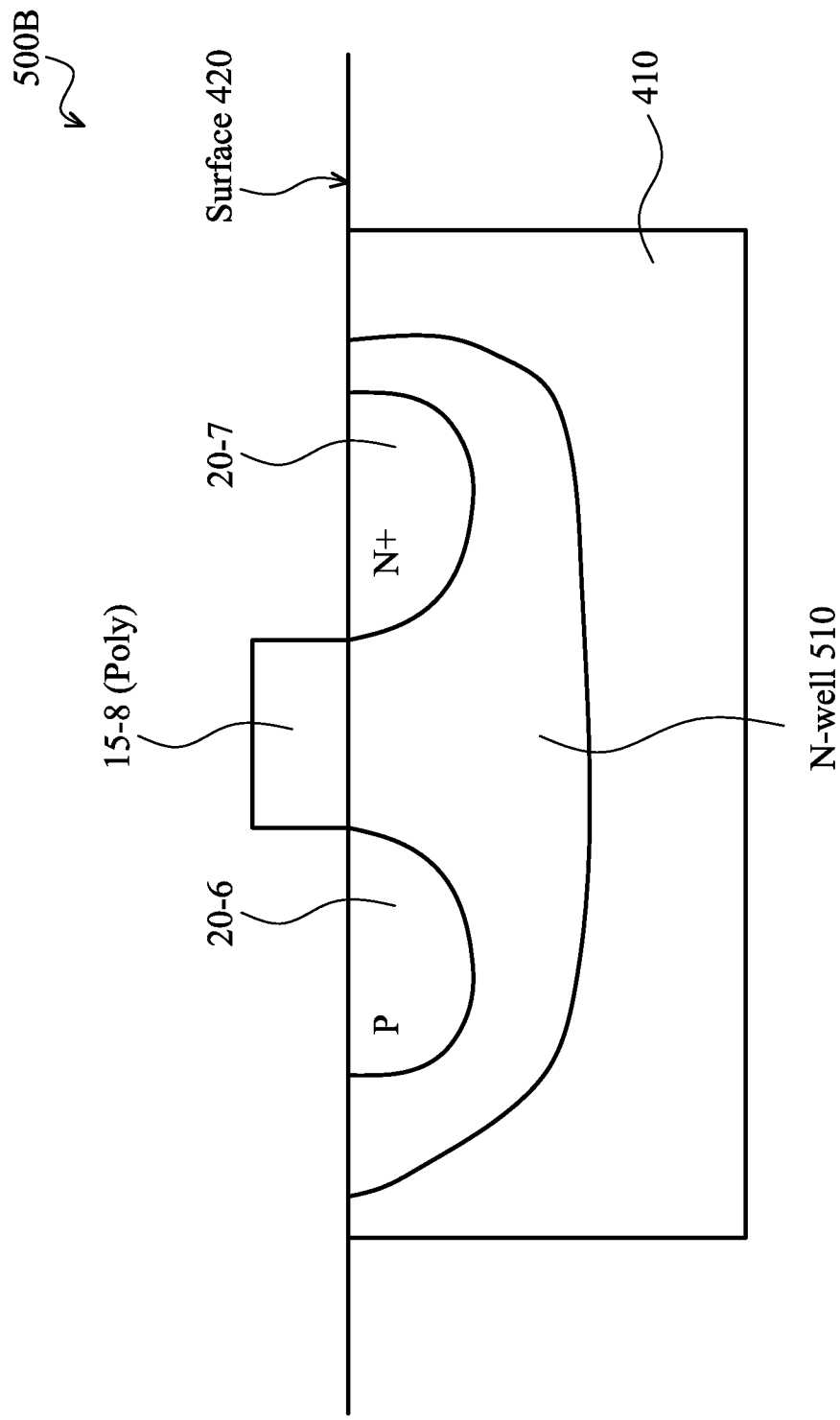

FIG. 5B is a cross sectional view 500B of tap device 200B in FIG. 2B, in accordance with some embodiments. Cross sectional view 500B is with reference to line CC in FIG. 4.

Diffusion area 20-6 is doped with P dopant. Diffusion 20-7 is doped with N+ dopant. Diffusion area 20-6 forms terminal 260 of tap device 200B. Diffusion area 20-7 forms terminal 270 of tap device 200B. Poly region 15-8 forms poly terminal 280 of tap device 200B. Similar to diffusion areas 20-11 and 20-10 in FIG. 5A, diffusion areas 20-6 and 20-7 are inside N-well 510 that forms terminal 290 of tap device 200B. Effectively, terminal 240 of tap device 200A and terminal 290 of tap device 200B are formed by the same N-well 510. In other words, terminals 240 of tap device 200A and terminal 290 of tap device 200B are electrically coupled together.

Tap device 200B is used for illustration, another tap device, such as tap device 200B' (not labeled) similar to and symmetrical with tap device 200B with reference to line AA is formed in layout structure 400. For example, tap device 200B' is formed by diffusion regions 20-9 and 20-8, and poly region 15-5, and should be recognizable by persons of ordinary skill in the art.

In some embodiments, the P dopant area formed by diffusion area 20-6 of tap device 200B is also the P dopant area that forms the source of a PMOS transistor of a memory cell, such as PMOS transistor P1 or P2 of memory cell 120 in FIG. 1. For illustration, the P dopant area of tap device 200B is the P dopant area of PMOS transistor P1, and forms the source of PMOS transistor P1. Explained in another way, half of the P dopant area belongs to tap device 200B while the other half of the P dopant area belongs to PMOS transistor P1.

FIG. 6A is a cross sectional view 600A of tap device 300A in FIG. 3A, in accordance with some embodiments. Cross sectional view 600A is with reference to line DD in FIG. 4.

Diffusion areas 20-14 and 20-15 are doped with P+ dopant, and are each inside a P-well 610 that is formed inside substrate 410. Diffusion area 20-15 forms terminal 310 of tap device 300A. Diffusion area 20-14 forms terminal 320 of tap device 300A. Poly region 15-2 forms poly terminal 330 of tap device 300A. P-well 610 forms terminal 340 of tap device 300A. In some embodiments, P-well 610 includes separate wells electrically connected together, and is therefore considered one single well.

Tap device 300A is used for illustration, another tap device, such as tap device 300A' (not labeled) similar to tap device 300A is formed in layout structure 400. For example, tap device 300A' is formed by diffusion regions 20-2 and 20-3, and poly region 15-7, and should be recognizable by persons of ordinary skill in the art.

Figure 6B:
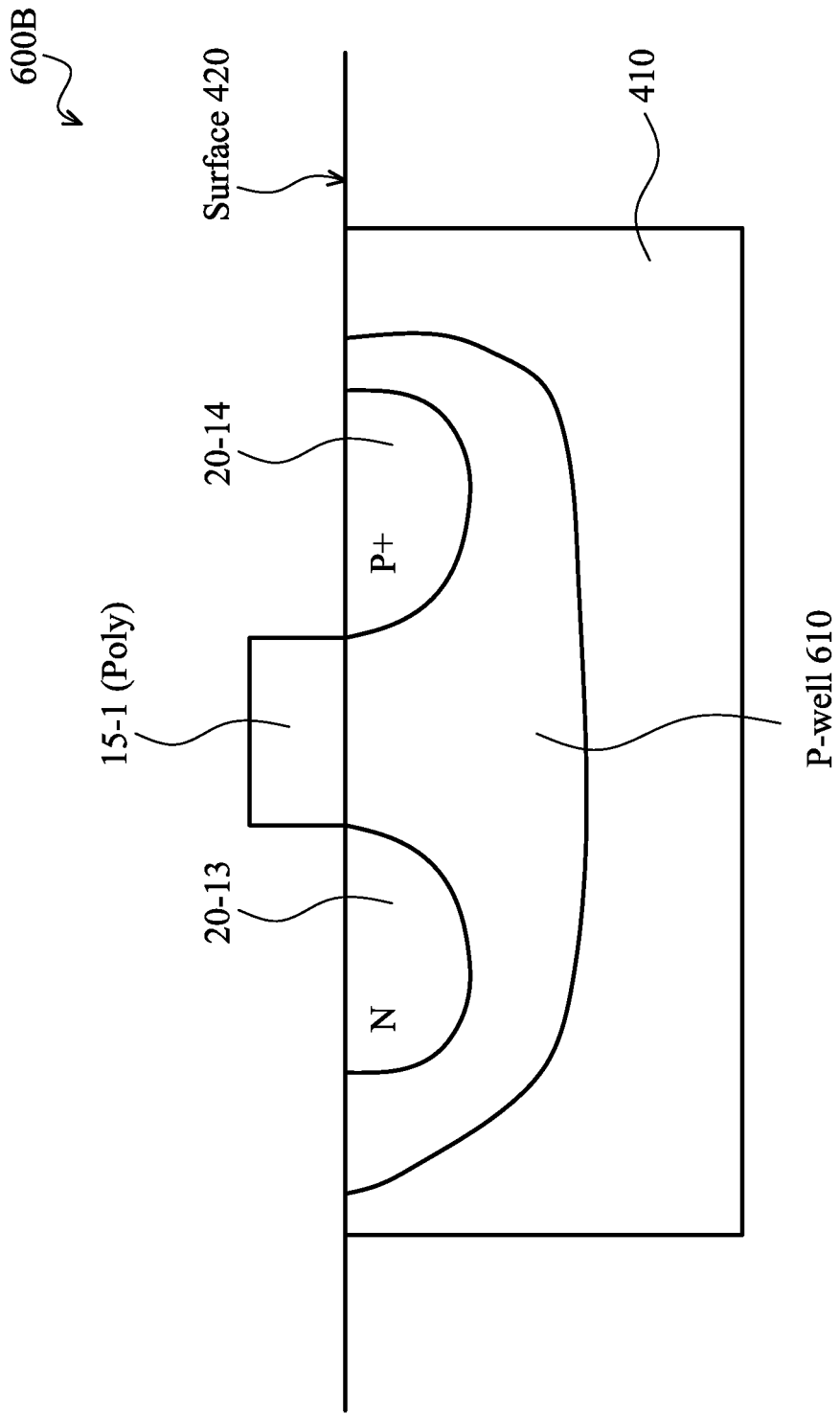

FIG. 6B is a cross sectional view 600B of tap device 300B in FIG. 3B, in accordance with some embodiments. Cross sectional view 300B is with reference to line EE in FIG. 4.

Diffusion area 20-14 is doped with P+ dopant. Diffusion 20-13 is doped with N dopant. Diffusion area 20-14 forms terminal 360 of tap device 300B. Diffusion area 20-13 forms terminal 370 of tap device 300B. Poly region 15-1 forms poly terminal 380 of tap device 300B. Similar to diffusion areas 20-15 and 20-14 in FIG. 5, diffusion areas 20-14 and 20-13 are inside P-well 610 that forms terminal 390 of tap device 300B. Effectively, terminal 340 of tap device 300A and terminal 390 of tap device 300B are formed by the same P-well 610. In other words, terminals 340 of tap device 300A and terminal 390 of tap device 300B are electrically coupled together.

Tap device 300B is used for illustration, another tap device, such as tap device 300B' (not labeled) similar to tap device 300B is formed in layout structure 400. For example, tap device 300B' is formed by diffusion regions 20-1 and 20-2, and poly region 15-8, and should be recognizable by persons of ordinary skill in the art.

Additional Exemplary Layouts

Figure 7:
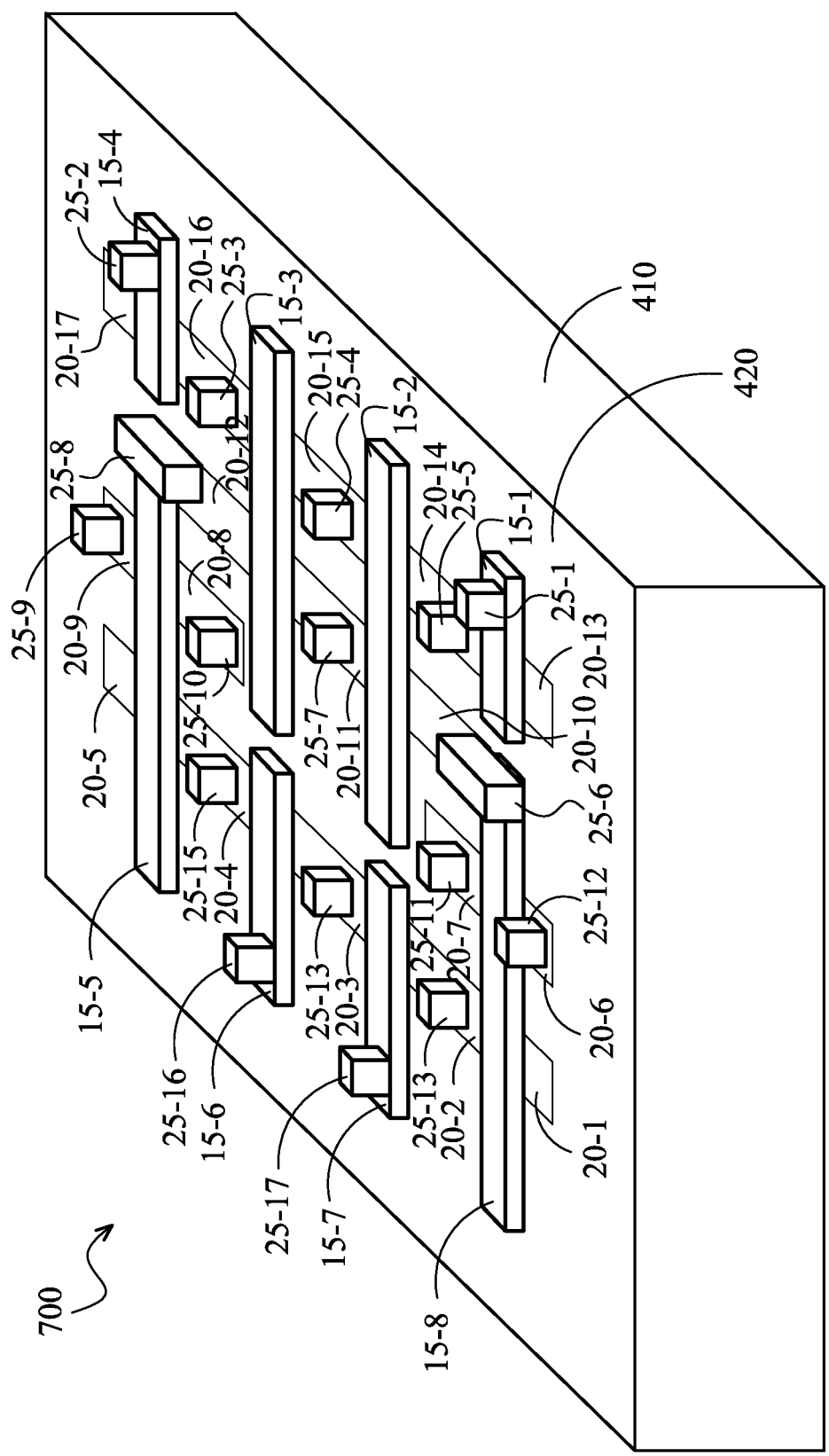
FIG. 7 is a diagram of a layout structure that includes the layout structure in FIG. 4 plus contact elements, in accordance with some embodiments.

FIG. 7 is a diagram of a layout structure 700, in accordance with some embodiments.

Layout structure 700 includes layout structure 400 plus a plurality of contact elements. For illustration, contact elements 25-1 to 25-17 are shown, and are collectively called contact elements 25. Contact elements 25 are used to electrically couple different circuit elements together. In some embodiments, contact elements 25 are each electrically connected with a corresponding diffusion area 20.

Contact elements 25-1, 25-2, 25-16, and 25-17 are shown on top of poly regions 15-1, 15-4, 15-6, and 15-7, respectively. Contact elements 25-5, 25-4, 25-3, 25-7, 25-12, 25-11, 25-10, 25-9, 25-15, 25-14, and 25-13 are shown on top of diffusion areas 20-14, 20-15, 20-16, 20-11, 20-6, 20-7, 20-8, 20-9, 20-4, 20-3, and 20-2, respectively. Contact element 25-6 is shown on top of diffusion area 20-10 and poly region 15-8. Contact element 25-8 is shown on top of diffusion area 20-12 and poly region 15-5.

Figure 8:
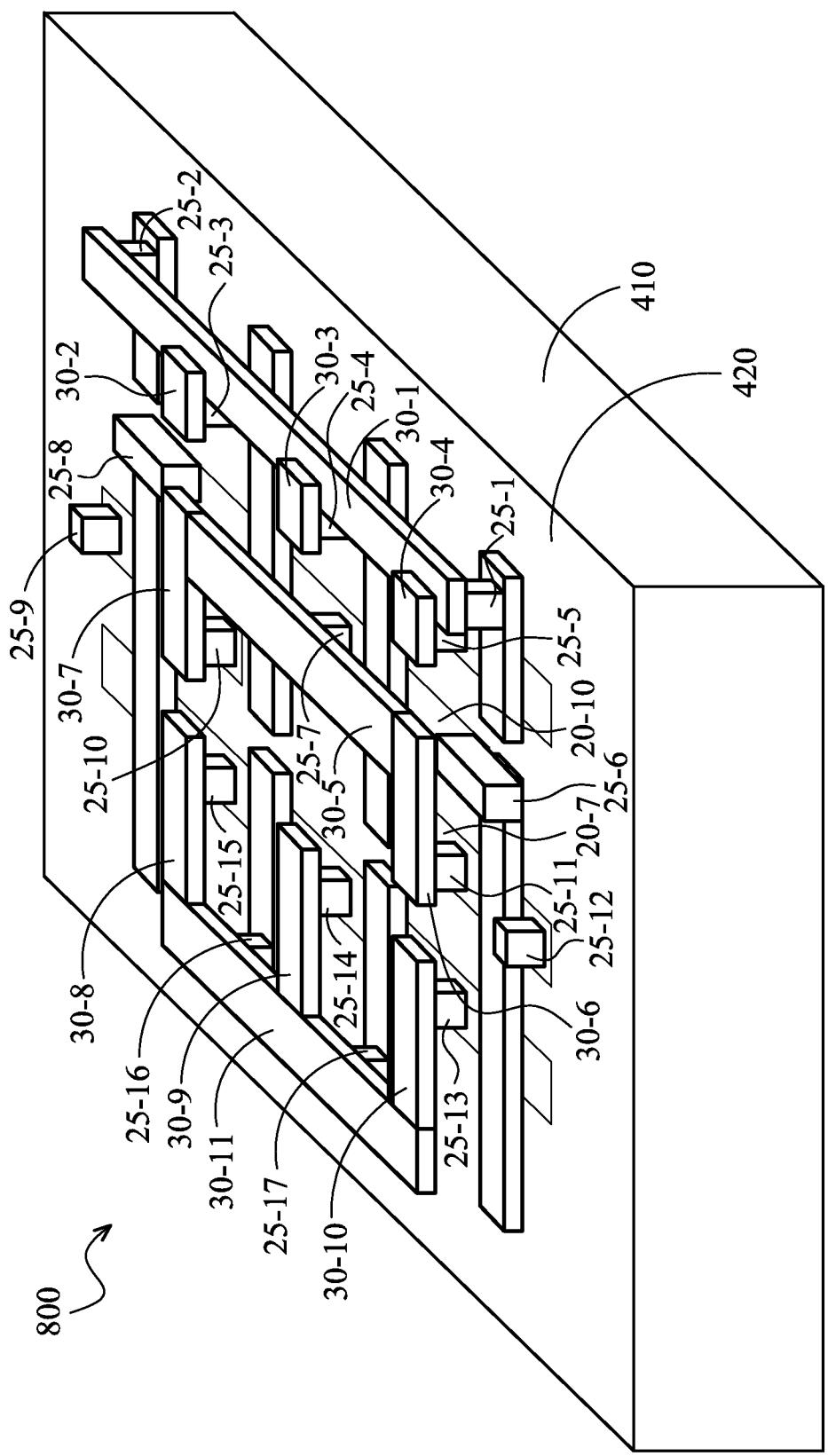
FIG. 8 is a diagram of a layout structure that includes the layout structure in FIG. 7 plus metal elements in a metal one layer, in accordance with some embodiments.

FIG. 8 is a diagram of a layout structure 800, in accordance with some embodiments.

Layout structure 800 includes layout structure 700 plus a plurality of metal elements in a metal one layer. To avoid obscuring the drawing, poly regions 15 and diffusion areas 20 are not labeled. For illustration, metal elements 30-1 to 30-11 are shown, and are collectively called metal elements 30.

Metal elements 30 are part of a layer, which, in some embodiments, is called metal one layer, and is a first metal layer above substrate 410. As a result, each of a metal element 30 is on a same level with other metal elements 30. A metal layer is commonly called an interconnect layer used for electrically connecting different devices and/or electrical elements. Metal is used in metal elements 30 for illustration. Other conductive materials are within the scope of various embodiments.

Metal element 30-1 is on top of contact elements 25-1 and 25-2.

Metal element 30-2 is on top of contact element 25-3. Metal element 30-3 is on top of contact element 25-4. Metal 30-4 is on top of contact element 25-5. Metal elements 30-2, 30-3, and 30-4 are each in contact with metal element 30-1.

Metal element 30-5 is on top of contact element 25-7. Metal element 30-6 is on top of contact element 25-11. Metal element 30-7 is on top of contact element 25-10. Each of metal element 30-6 and 30-7 is in contact with metal element 30-5

Metal element 30-8 is on top of contact element 25-15. Metal element 30-9 is on top of contact element 25-14. Metal element 30-10 is on top of contact element 25-13. Metal element 30-11 is on top of contact elements 25-17 and 25-16. Metal elements 30-8, 30-9, and 30-10 are each in electrical connection with metal element 30-11.

Effectively, diffusion area 20-10 is electrically coupled with contact element 25-6, metal element 30-6, contact element 25-11, and diffusion area 20-7. Diffusion area 20-10 corresponds to the N+ region of tap device 200A that forms terminal 220. Diffusion area 20-7 corresponds to the N+ region of tap device 200B that forms terminal 270. As a result, terminals 220 and 270 of corresponding tap devices 200A and 200B are electrically coupled together.

Figure 9:
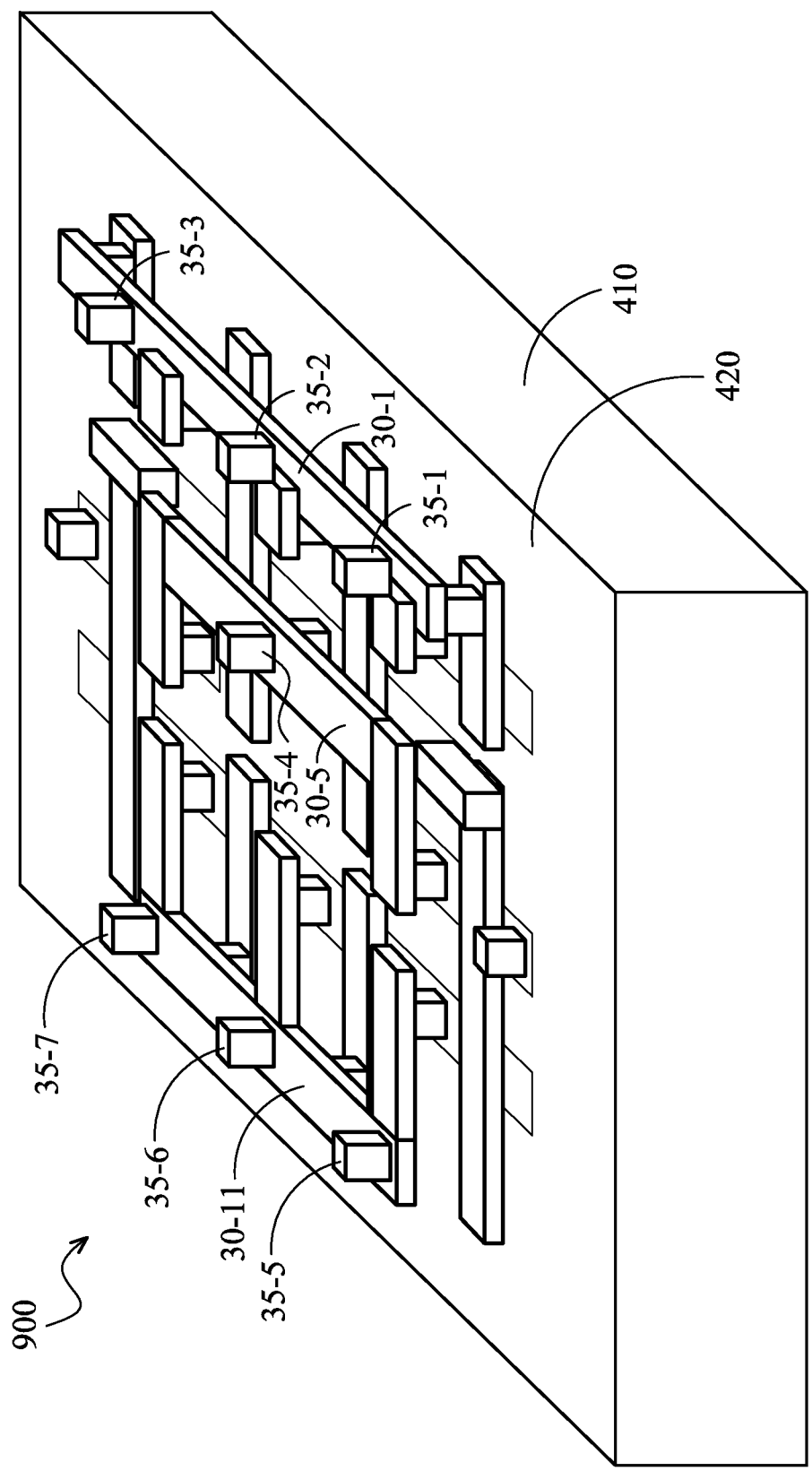
FIG. 9 is a diagram of a layout structure that includes the layout structure in FIG. 8 plus a plurality of vias, in accordance with some embodiments.

FIG. 9 is a diagram of a layout structure 900, in accordance with some embodiments.

Layout structure 900 includes layout structure 800 plus a plurality of vias. For illustration, vias 35-1 to 35-7 are shown, and are collectively called vias 35. For simplicity, various metal elements 30, contact elements 25, diffusion areas 20, and poly regions 15 are not labeled. Vias 35 are used to connect elements of different metal layers, which will be explained with reference to FIG. 10. As illustratively shown, vias 35 are shown in electrical connection with corresponding metal elements 30.

Vias 35-1, 35-2, and 35-3 are in electrical connection with metal element 30-1. Via 35-4 is in electrical connection with metal element 30-5. Vias 35-5, 35-6, and 35-7 are in electrical connection with metal element 30-11.

Figure 10:
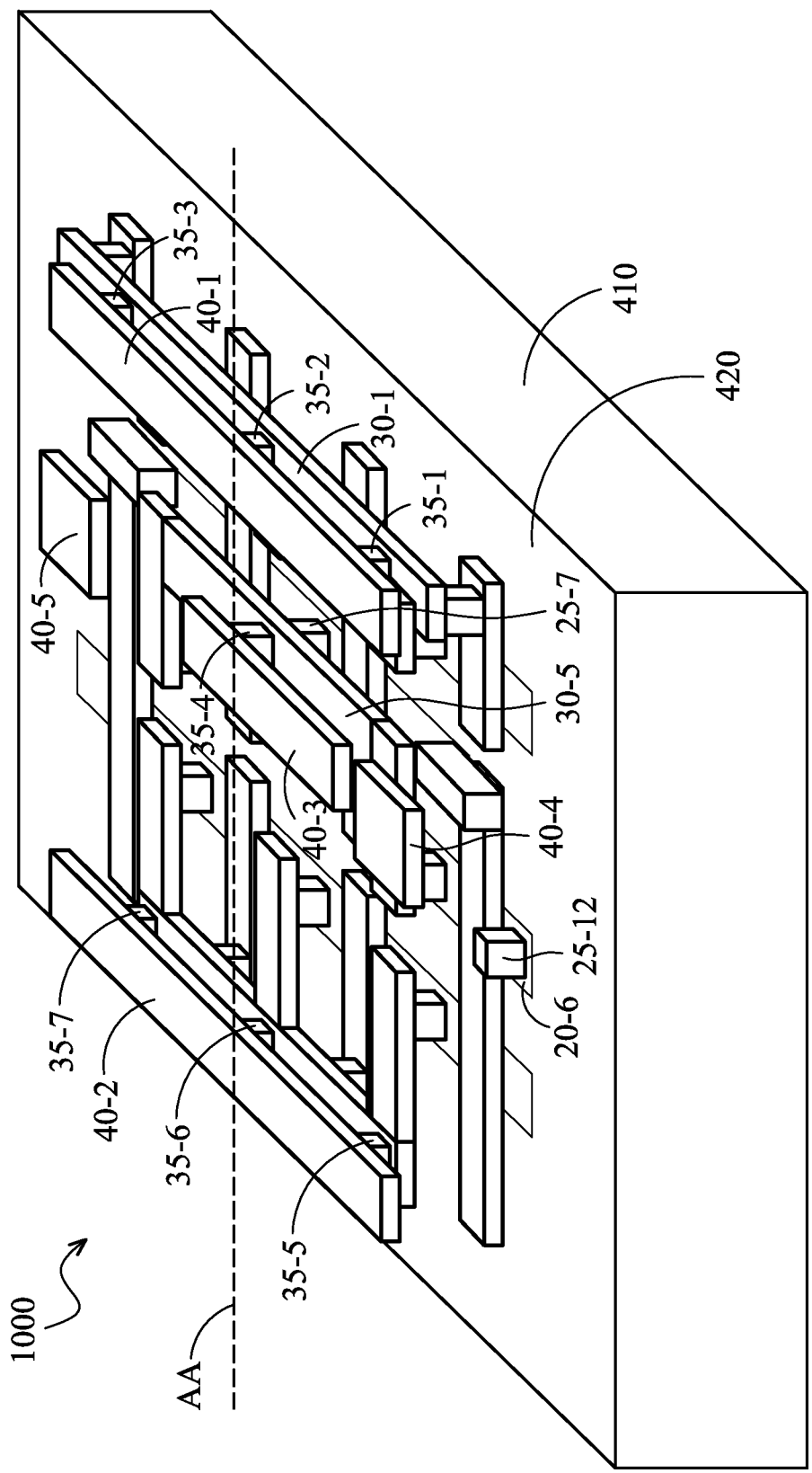
FIG. 10 is a diagram of a layout structure that includes the layout structure in FIG. 9 plus metal elements in a metal two layer, in accordance with some embodiments.

FIG. 10 is a diagram of a layout structure 1000, in accordance with some embodiments.

Layout structure 1000 includes layout structure 900 plus a plurality of metal elements in a metal two layer. For simplicity, some elements in FIGS. 4 to 9 are not labeled.

For illustration, metal elements 40-1 to 40-5 are shown, and are collectively called metal elements 40. Metal elements 40 are part of a metal layer, which, in some embodiments, is called metal two layer, and is the second metal layer above substrate 410. As a result, each metal element 40 is on a same level with other metal elements 40. Metal two layer is further from substrate 410 than metal one layer.

Similar to metal one layer, elements of metal two layer are used to electrically connect different elements and/or devices. Metal is used in metal elements 40 for illustration. Other conductive elements are within the scope of various embodiments.

Metal element 40-1 is in electrical connection with vias 35-1, 35-2, and 35-3. Metal element 40-2 is in electrical connection with vias 35-5, 35-6, and 35-7.

Metal element 40-3 is electrically connected with via 35-4.

Metal element 40-4 is explained in detail with reference to FIG. 11. Metal element 40-5 is symmetrical with metal element 40-5.

Figure 11:
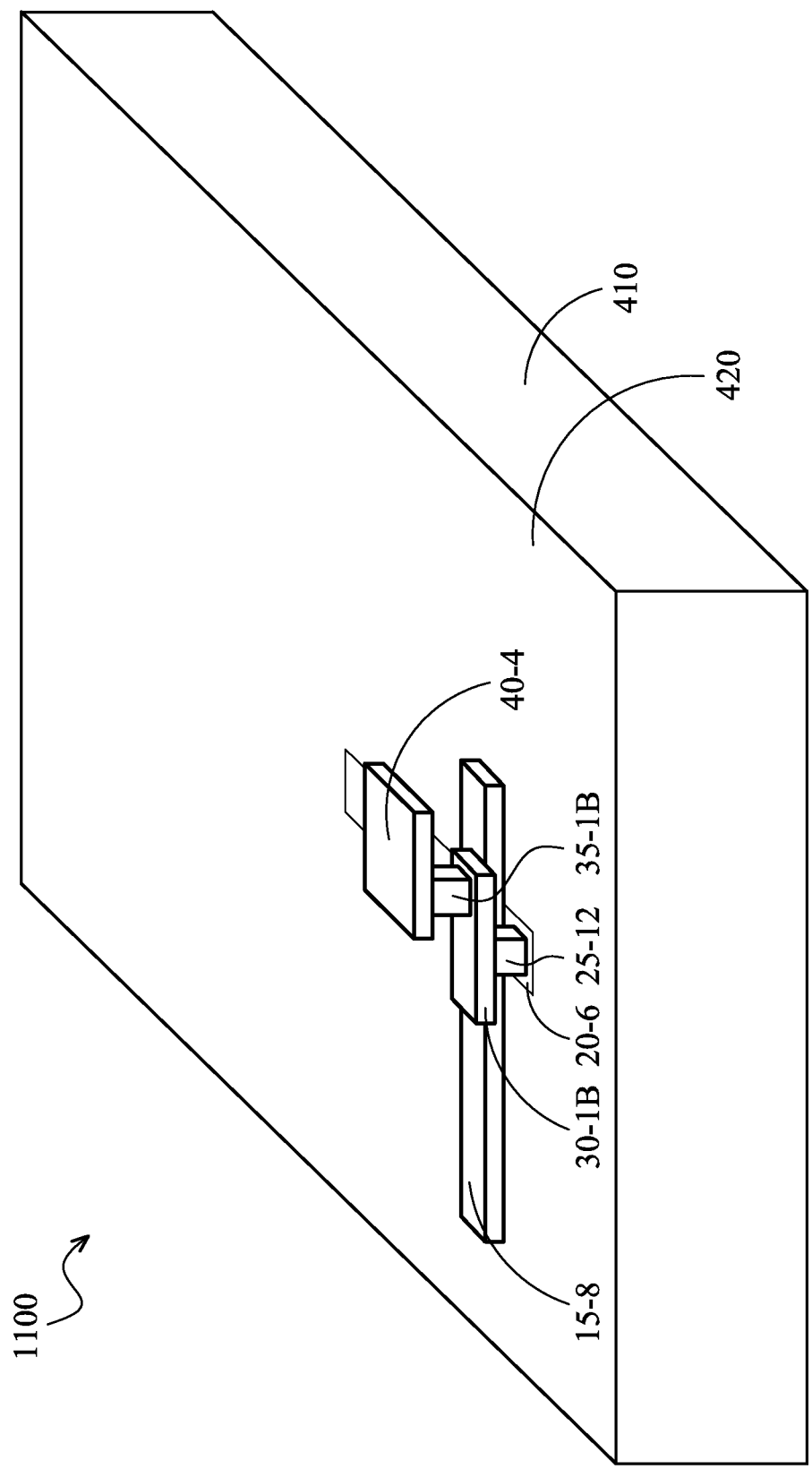
FIG. 11 is a diagram of a layout structure of FIG. 10 showing layout components of the source of a PMOS transistor in the memory cell of FIG. 1, in accordance with some embodiments.

FIG. 11 is a layout structure 1100, in accordance with some embodiments.

Layout structure 1100 is layout structure 1000 showing layout elements of the source of transistor P1 in FIG. 1.

Metal element 40-4 is electrically connected with a via 35-1B, a metal one element 30-1B, contact element 25-12, and diffusion area 20-6. Diffusion area 20-6 forms the source of PMOS transistor P1 of memory cell 120 in FIG. 1, as explained above with reference to FIG. 5B. Via 35-1B and metal one element 30-1B, in some embodiments, are considered to be in a bit cell area. In contrast, layout 1000 is considered to be in the strap cell area.

In some embodiments, metal element 40-4 is configured as node NVDDI in FIG. 1, which is coupled to the source of transistor P1. In other words, metal element 40-4 is configured to receive a voltage source that provides the operational voltage value to the source of transistor P1. Metal element 40-5 in FIG. 10 is symmetrical to metal element 40-4 with reference to line AA, and is configured to receive a voltage source that provides the operational voltage value VDD to the source of a PMOS transistor in a memory cell similar to memory cell 120 in FIG. 1, and should be recognizable by persons of ordinary skill in the art.

Figure 12:
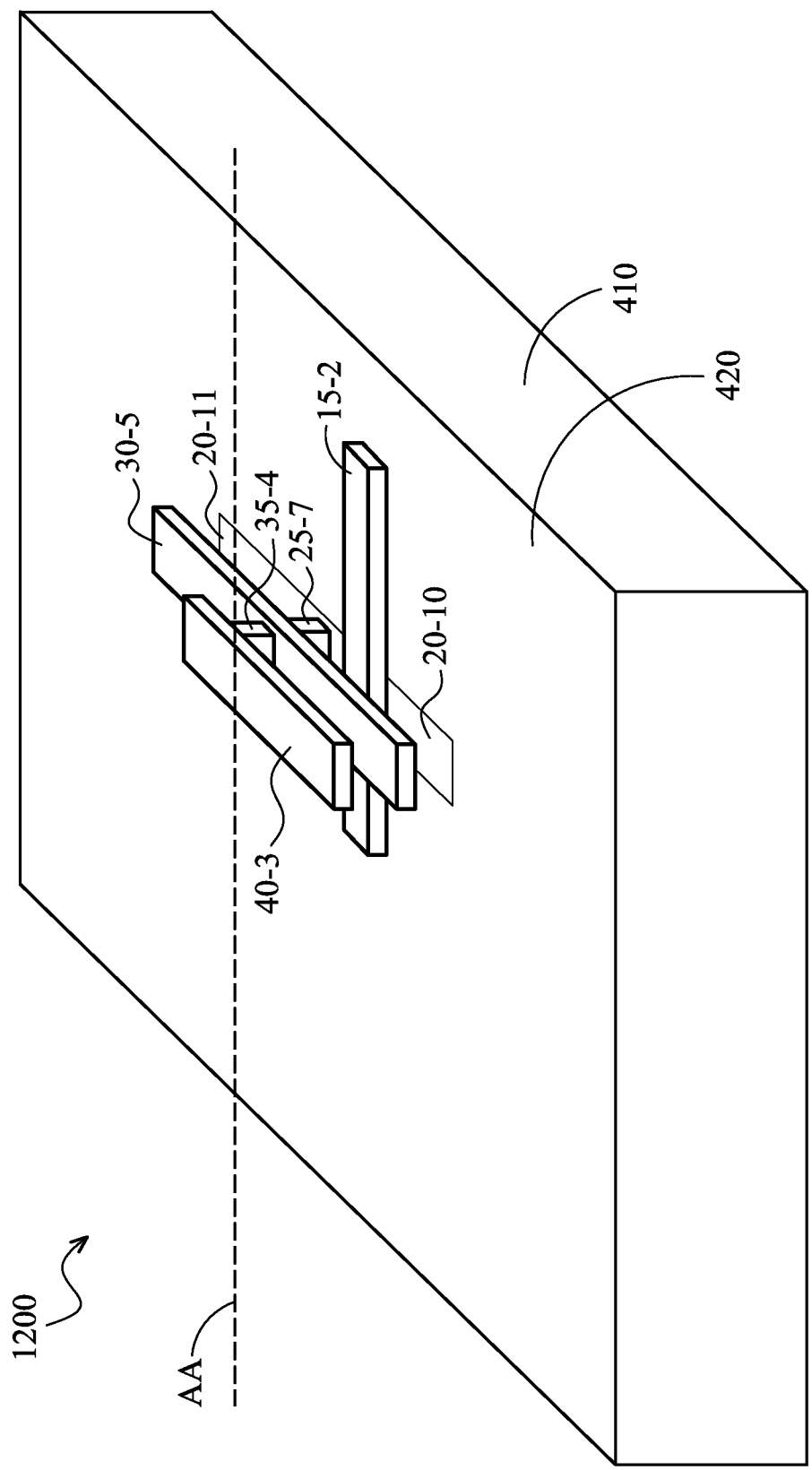
FIG. 12 is a diagram of a layout structure of FIG. 10 showing layout components of the bulk of the PMOS transistor in the memory cell of FIG. 1, in accordance with some embodiments.

FIG. 12 is a layout structure 1200, in accordance with some embodiments.

Layout structure 1200 is layout structure 1000 showing layout elements of a bulk BP1 of transistor P1 in FIG. 1.

Metal element 40-3 is electrically connected with via 35-4, metal element 30-5, contact element 25-7, and diffusion area 20-11. As illustratively shown in FIG. 5, below diffusion area 20-11 is N-well 510, which is also bulk BP1 of PMOS transistor P1 in FIG. 1. In some embodiments, metal element 40-3 is configured to receive a voltage source having a voltage value. Effectively, N-well 510 or bulk BP1 receives the voltage value. Further, the voltage value is used to control the leakage current between the source and bulk BP1 of transistor P1.

Figure 13:
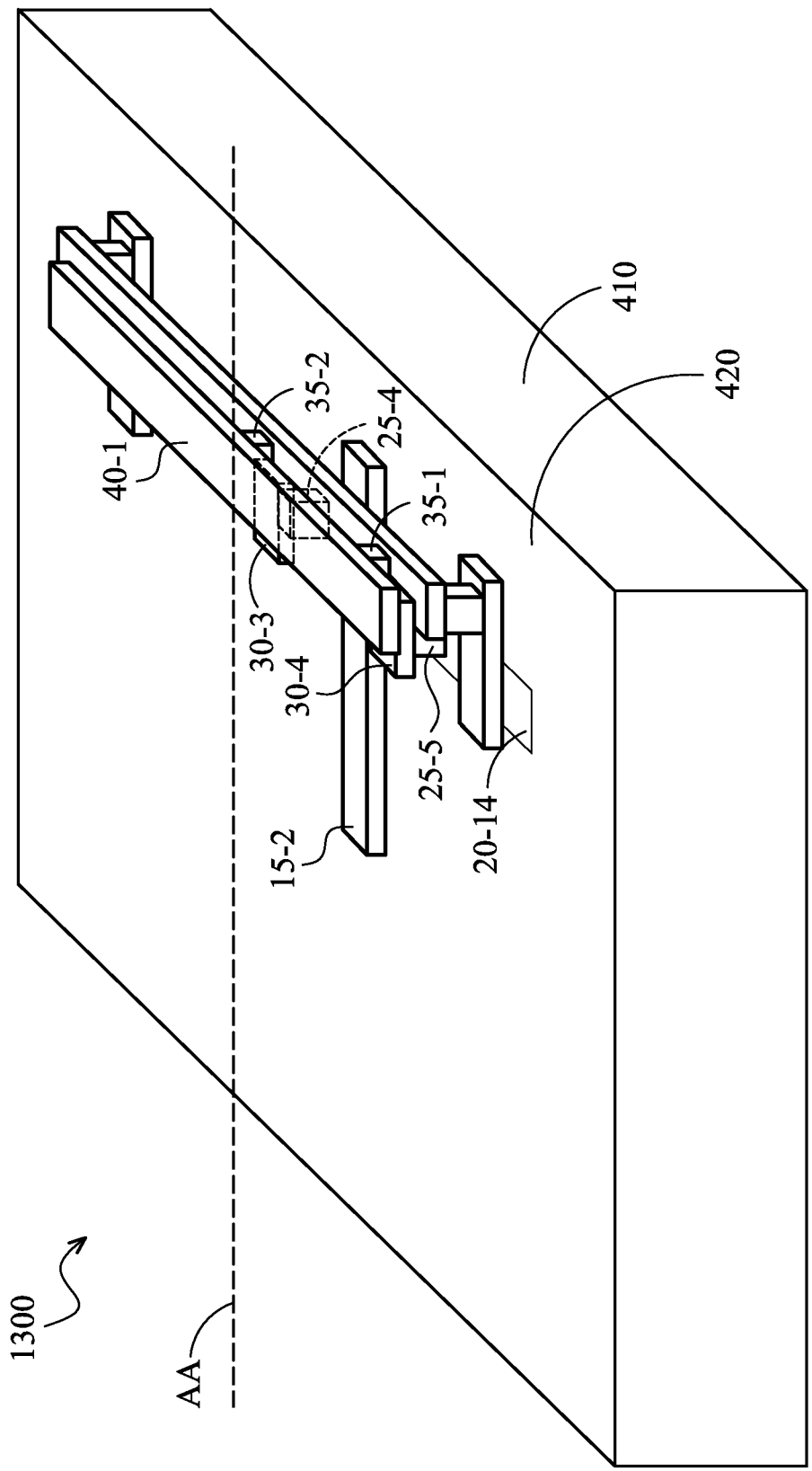
FIG. 13 is a diagram of a layout structure of FIG. 10 showing layout components of a reference voltage VSS in the memory cell of FIG. 1, in accordance with some embodiments.

FIG. 13 is a layout structure 1300, in accordance with some embodiments.

Layout structure 1300 is layout structure 1000 showing layout elements of reference voltage VSS of memory cell 120 in FIG. 1.

Metal element 40-1 is in electrical coupled with vias 35-1, 35-2, metal elements 30-1, 30-3, 30-4, contact elements 25-4, 25-5, and diffusion areas 20-15, 20-14. Reference numbers for diffusion areas 20-15 and 20-14 are shown but are not pointing to diffusion areas 20-15 and 20-14 because diffusion areas 20-15 and 20-14 are not visible in layout structure 1300. Visible diffusion areas 20-15 and 20-14 are shown in FIG. 7. As illustrated in FIG. 6A, below diffusion areas 20-15 and 20-14 is P-well 610, which is also the bulk of an NMOS, such as NMOS transistor N1 in FIG. 1.

In some embodiments, metal element 40-1 is configured to receive a voltage source having a reference voltage value VSS or ground. Effectively, P-well 610 or the bulk of an NMOS transistor receives reference voltage value VSS.

Figure 14:
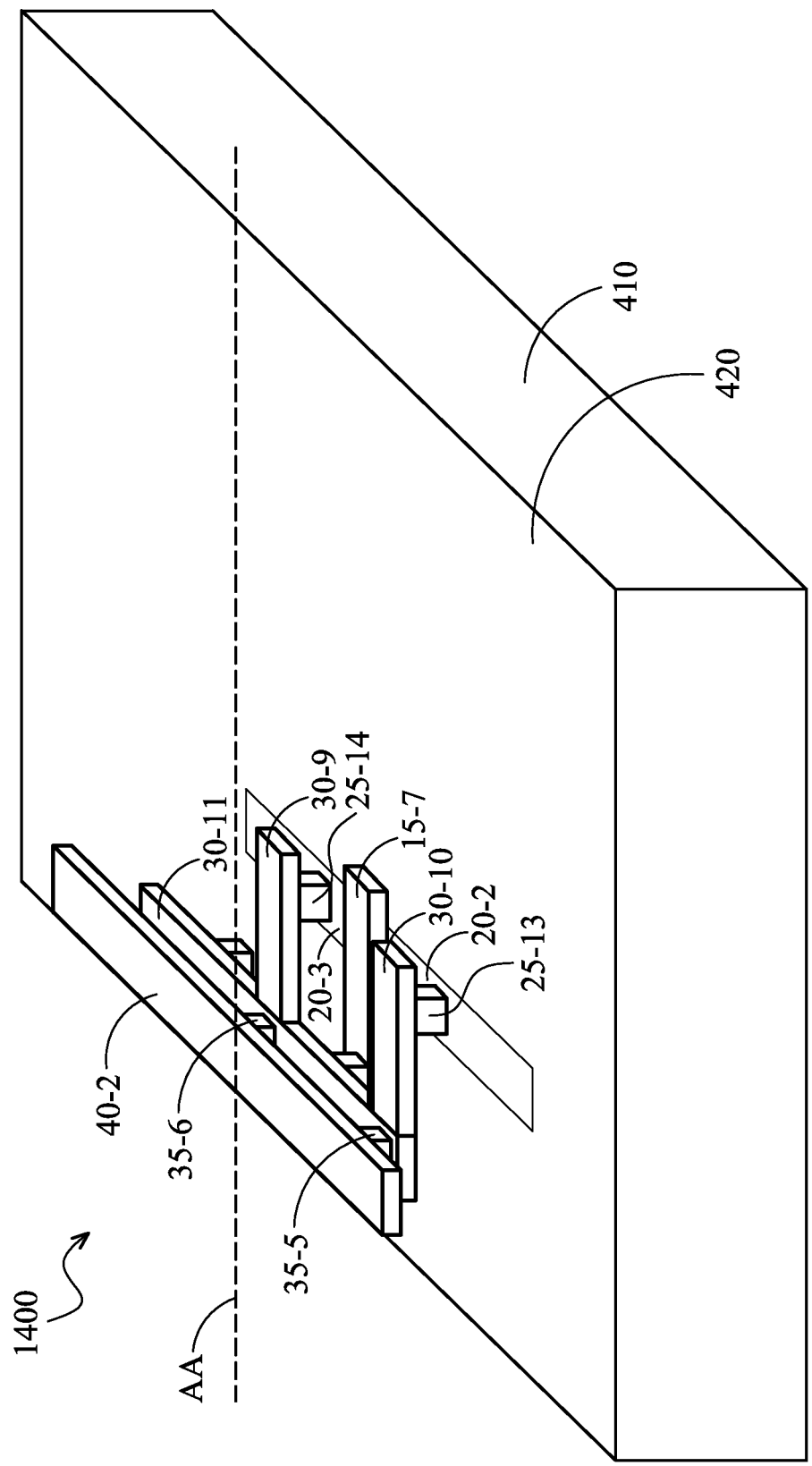
FIG. 14 is a diagram of a layout structure of FIG. 10 showing other layout components of the reference voltage VSS in the memory cell of FIG. 1, in accordance with some embodiments.

FIG. 14 is a layout structure 1400, in accordance with some embodiments.

Layout structure 1400 is layout structure 1000 showing additional layout elements of reference voltage VSS of memory cell 120 in FIG. 1.

Metal element 40-2 is in electrical coupled with vias 35-5, 35-6, metal elements 30-11, 30-10, 30-9, contact elements 25-17, 25-13, 25-14 and diffusion areas 20-2, 20-3. In some embodiments, below diffusion areas 20-2 and 20-3 is P-well 610, which is also the bulk of an NMOS transistor, such as NMOS transistor N2 in FIG. 1.

In some embodiments, metal element 40-2 is configured to receive a voltage source having a reference voltage value VSS or ground. Effectively, P-well 610, the bulk of an NMOS transistor, receives reference voltage value VSS.

Various embodiments of the disclosure are advantageous over existing approaches in which the bulk and the source of the PMOS transistors are physically connected to each other and are thus configured to receive one voltage value from one power source. In the following illustration, transistor P1 in FIG. 1 is used for explanation. The inventive concept is equally applicable to PMOS transistor P2. For example, when PMOS transistor P1 is powered-off, the source of PMOS transistor P1 is configured to receive 0 V from the first power source. In contrast, when PMOS transistor P1 is powered-on, the source of PMOS transistor P1 is configured to receive operational voltage value VDD, such as 0.85 V. Further, bulk BP1 of PMOS transistor P1 is configured to receive from the second power source a second voltage value equal to operational voltage value VDD. As a result, the voltage at the source of PMOS transistor P1 is always less than the voltage at bulk BP1 of PMOS transistor P1. Simulation is then performed to determine the peak current between the source of PMOS transistor P1 and bulk BP1, and is used to calculate other design parameters, such as operating current, for transistors in memory cell 120. For another example, the source of PMOS transistor P1 is configured to receive operational voltage value VDD. Bulk BP1 of PMOS transistor P1 is configured to receive varying voltages to reduce a leakage current to an acceptable value.

A number of embodiments have been described. It will nevertheless be understood that various modifications may be made without departing from the spirit and scope of the disclosure. For example, various transistors being shown as a particular dopant type, such as, N-type or P-type Metal Oxide Semiconductor (NMOS or PMOS), are for illustration purposes. Embodiments of the disclosure are not limited to a particular type. Selecting different dopant types for a particular transistor is within the scope of various embodiments. The low or high logic value of various signals used in the above description is also for illustration. Various embodiments are not limited to a particular value when a signal is activated and/or deactivated. Selecting different values is within the scope of various embodiments. Different metal elements in electrical contact with other metal elements are for illustration. A single piece of metal element used in place of different metal elements being in electrical connection with one another is within the scope of various embodiments. For example, a single piece of metal element can be used in place of metal elements 30-11, 30-10, 30-9, and 30-8. A single piece of metal element can be used in place of metal elements 30-5, 30-6, and 30-7, etc.

In some embodiments, a layout structure includes a substrate, a well, a first dopant area, a second dopant area, a first poly region, a third dopant area, a fourth dopant area, and a second poly region. The well is in the substrate. The first poly region is in between the first dopant area and the second dopant area. The second poly region is in between the third dopant area and the fourth dopant area. The first dopant area, the second dopant area, the third dopant area, and the fourth dopant area are in the well. The first dopant area is configured to serve as a source of a transistor and to receive a first voltage value from a first power supply source. The well is configured to serve as a bulk of the transistor and to receive a second voltage value from a second power supply source.

In some embodiments, a layout structure comprises a substrate, a well, a first dopant area, a first contact element, a first conductive element on a level of a first conductive layer, a first via, a first conductive element on a level of a second conductive layer, a second dopant area, a second contact element, a second conductive element on the level of the first conductive layer, a second via, and a second conductive element on the level of the second conductive layer. The well is in the substrate. The first dopant area is in the well. The first contact element is in electrical connection with the first dopant area. The first conductive element on the level of a first conductive layer is in electrical connection with the first contact element. The first via is in electrical connection with the first conductive element on the level of the first conductive layer. The first conductive element on the level of the second conductive layer is in electrical connection with the first via. The second dopant area is in the well. The second contact element is in electrical connection with the second dopant area. The second conductive element on the level of the first conductive layer is in electrical connection with the second contact element. The second via is in electrical connection with the second conductive element on the level of the first conductive layer. The second conductive element on the level of the second conductive layer is in electrical connection with the second via. The first conductive element on the level of the second conductive layer is configured to be electrically coupled with a first power supply source. The second conductive element on the level of the second conductive layer is configured to be electrically coupled with a second power supply source different from the first power supply source.

In some embodiments, a layout structure comprises, a substrate, a well, a first dopant area, a first contact element, a first conductive element on a level of a first conductive layer, a first via, a first conductive element on a level of a second conductive layer, a second dopant area, a second contact element, a second conductive element on the level of the first conductive layer, a second via, a second conductive element on the level of the second conductive layer and a poly region. The well is in the substrate. The first dopant area is in the well. The first contact element is in electrical connection with the first dopant area. The first conductive element on the level of the first conductive layer is in electrical connection with the first contact element. The first via is in electrical connection with the first conductive element on the level of the first conductive layer. The first conductive element on the level of the second conductive layer is in electrical connection with the first via. The second dopant area is in the well. The second contact element is in electrical connection with the second dopant area. The second conductive element on the level of the first conductive layer is in electrical connection with the second contact element. The second via is in electrical connection with the second conductive element on the level of the first conductive layer. The second conductive element on the level of the second conductive layer is in electrical connection with the second via. The poly region is in between the first dopant area and the second dopant area. The well is configured to serve as a bulk of a transistor used in a cross-coupled pair of a memory cell. The second dopant area is configured to serve as a source of the transistor.

The above illustration includes exemplary steps, but the steps are not necessarily performed in the order illustrated. Steps may be added, replaced, changed order, and/or eliminated as appropriate, in accordance with the spirit and scope of disclosed embodiments.

What is claimed is:

1. A layout structure comprising:
    a substrate;
    a well in the substrate;
    a first dopant area in the well;
    a first contact element in electrical connection with the first dopant area;
    a first conductive element on a level of a first conductive layer and in electrical connection with the first contact element;
    a first via in electrical connection with the first conductive element on the level of the first conductive layer;
    a first conductive element on a level of a second conductive layer and in electrical connection with the first via;
    a second dopant area in the well;
    a second contact element in electrical connection with the second dopant area;
    a second conductive element on the level of the first conductive layer and in electrical connection with the second contact element;
    a second via in electrical connection with the second conductive element on the level of the first conductive layer; and
    a second conductive element on the level of the second conductive layer and in electrical connection with the second via,
    wherein
        the first conductive element on the level of the second conductive layer is configured to be electrically coupled with a first power supply source; and
        the second conductive element on the level of the second conductive layer is configured to be electrically coupled with a second power supply source different from the first power supply source.

2. The layout structure of claim 1, wherein
the well is configured to serve as a bulk of a p-type metal-oxide-semiconductor (PMOS) transistor used in a cross-coupled pair of a memory cell; and
the second dopant area is configured to serve as a source of the PMOS transistor.

3. The layout structure of claim 1, wherein
the well is an N-well;
the first dopant area is an N+ dopant area; and
the second dopant area is a P dopant area.

4. The layout structure of claim 1, wherein
the first conductive element on the level of the second conductive layer is configured to receive an operational voltage value from the first power supply source; and
the second conductive element on the level of the second conductive layer is configured to receive the operational voltage value from the second power supply source.

5. The layout structure of claim 1, wherein
the second conductive element on the level of the first conductive layer and the second via are in a layout area of memory cells of a memory macro; and
the first contact element, the first conductive element on the level of the first conductive layer, the first via, the first conductive element on the level of the second conductive layer, the second dopant area, the second contact element, and the second conductive element on the level of the second conductive layer are in a layout area of strap cells of the memory macro.

6. The layout structure of claim 1, wherein
the layout structure further includes
a reference dopant area;
a reference contact element in electrical connection with the reference dopant area;
a reference conductive element on the level of the first conductive layer;
a reference via in electrical connection with the reference conductive element on the level of the first conductive layer; and
a reference conductive element on the level of the second conductive layer and in electrical connection with the reference via; and
the reference conductive element on the level of the second conductive layer is electrically coupled with a reference voltage source.

7. The layout structure of claim 6, wherein
the reference conductive element on the level of the first conductive layer is in electrical connection with the reference contact element.

8. A layout structure comprising:
a substrate;
a well in the substrate;
a first dopant area in the well;
a first contact element in electrical connection with the first dopant area;
a first conductive element on a level of a first conductive layer and in electrical connection with the first contact element;
a first via in electrical connection with the first conductive element on the level of the first conductive layer;
a first conductive element on a level of a second conductive layer and in electrical connection with the first via;
a second dopant area in the well;
a second contact element in electrical connection with the second dopant area;
a second conductive element on the level of the first conductive layer and in electrical connection with the second contact element;
a second via in electrical connection with the second conductive element on the level of the first conductive layer;
a second conductive element on the level of the second conductive layer and in electrical connection with the second via; and
a poly region in between the first dopant area and the second dopant area,
wherein
the well is configured to serve as a bulk of a transistor used in a cross-coupled pair of a memory cell and to receive a first voltage value from a first power supply source; and
the second dopant area is configured to serve as a source of the transistor and to receive a second voltage value from a second power supply source.

9. The layout structure of claim 8, wherein
the first conductive element on the level of the first conductive layer is formed by a conductive element running in a first direction and a conductive element running in a second direction perpendicular to the first direction.

10. The layout structure of claim 8, wherein
the first conductive element on the level of the second conductive layer is configured to be electrically coupled with the first power supply source; and
the second conductive element on the level of the second conductive layer is configured to be electrically coupled with the second power supply source different from the first power supply source.

11. The layout structure of claim 8, wherein
the well is an N-well;
the first dopant area is an N+ dopant area; and
the second dopant area is a P dopant area.

12. The layout structure of claim 8, wherein
the poly region is further between a third dopant region and a fourth dopant region.

13. The layout structure of claim 8, wherein
the layout structure further includes
a reference dopant area;
a reference contact element in electrical connection with the reference dopant area;
a reference conductive element on the level of the first conductive layer;
a reference via in electrical connection with the reference conductive element on the level of the first conductive layer; and
a reference conductive element on the level of the second conductive layer and in electrical connection with the reference via; and
the reference conductive element on the level of the second conductive layer is electrically coupled with a reference voltage source.

14. The layout structure of claim 13, wherein
the reference conductive element on the level of the first conductive layer is in electrical connection with the reference contact element.

15. A layout structure comprising:
a substrate;
a well in the substrate;
a first dopant area;
a second dopant area, the first dopant area and the second dopant area having different dopant types;
a first poly region in between the first dopant area and the second dopant area;
a third dopant area;
a fourth dopant area; and
a second poly region in between the third dopant area and the fourth dopant area, wherein
- the first dopant area, the second dopant area, the third dopant area, and the fourth dopant area are in the well;
- the first dopant area is configured to serve as a source of a transistor and to receive a first voltage value from a first power supply source; and
- the well is configured to serve as a bulk of the transistor and to receive a second voltage value from a second power supply source.

16. The layout structure of claim 15, wherein
the transistor is a p-type metal-oxide-semiconductor (PMOS) transistor being part of a cross-coupled pair of a memory cell.

17. The layout structure of claim 15, wherein
the first dopant area includes P dopant;
the second dopant area, the third dopant area, and the fourth dopant area include N+ dopant; and
the well includes N dopant.

18. The layout structure of claim 15, further comprising:
a first contact element in electrical connection with the first dopant area;
a second contact element in electrical connection with the second dopant area;
a third contact element in electrical connection with the third dopant area; and
a fourth contact element in electrical connection with the fourth dopant area.

19. The layout structure of claim 18 wherein the third contact element is in electrical connection with the first poly region.

20. The layout structure of claim 18, further comprising
a first conductive element in electrical connection with the first contact element; and
a second conductive element in electrical connection with the second contact element, the third contact element, and the fourth contact element.

21. The layout structure of claim 20, wherein
the second conductive element includes a third conductive element in electrical connection with a fourth conductive element.

22. The layout structure of claim 20, further comprising:
a first via in electrical connection with the first conductive element; and
a second via in electrical connection with the second conductive element.

23. The layout structure of claim 22, further comprising:
a third conductive element in electrical connection with the first via; and
a fourth conductive element in electrical connection with the second via,
wherein
- the first conductive element and the second conductive element are on a level of a first conductive layer; and
- the third conductive element and the fourth conductive element are on a level of a second conductive layer.

24. The layout structure of claim 15, wherein
the first voltage value is different from the second voltage value.

25. The layout structure of claim 15, wherein
the layout structure further includes
- a reference dopant area;
- a reference contact element in electrical connection with the reference dopant area;
- a reference conductive element on the level of the first conductive layer;
- a reference via in electrical connection with the reference conductive element on the level of the first conductive layer; and
- a reference conductive element on the level of the second conductive layer and in electrical connection with the reference via; and
the reference conductive element on the level of the second conductive layer is electrically coupled with a reference voltage source.

26. The layout structure of claim 25, wherein
the reference conductive element on the level of the first conductive layer is in electrical connection with the reference contact element.

* * * * *